United States Patent [19]
Ouchi et al.

[11] Patent Number: 5,912,654
[45] Date of Patent: Jun. 15, 1999

[54] ELECTRIC-CIRCUIT BOARD FOR A DISPLAY APPARATUS

[75] Inventors: Toshimichi Ouchi, Yokohama; Masanori Takahashi, Chigasaki; Hideo Mori, Yokohama; Kenji Niibori, Chigasaki, all of Japan

[73] Assignee: Canon Kabushiki Kaisha, Tokyo, Japan

[21] Appl. No.: 08/619,341

[22] Filed: Mar. 21, 1996

[30] Foreign Application Priority Data

Mar. 27, 1995 [JP] Japan ................................. 7-068245

[51] Int. Cl.$^6$ ....................................... G09G 3/36
[52] U.S. Cl. ........................... 345/98; 349/149; 361/748
[58] Field of Search ............................. 345/99, 98, 100, 345/905; 349/149, 150, 155; 29/837; 361/748, 736, 762

[56] References Cited

U.S. PATENT DOCUMENTS

| | | | |
|---|---|---|---|
| 4,655,551 | 4/1987 | Washizuka et al. | 349/150 |
| 4,674,182 | 6/1987 | Igarashi | 29/837 |
| 4,685,769 | 8/1987 | Fukuma et al. | 345/98 |
| 4,772,100 | 9/1988 | Suenaga | 349/149 |
| 5,283,677 | 2/1994 | Sagawa et al. | 349/150 |
| 5,402,255 | 3/1995 | Nakanishi et al. | 349/150 |
| 5,546,208 | 8/1996 | Shimizu et al. | 349/155 |

FOREIGN PATENT DOCUMENTS

| | | |
|---|---|---|
| 1300590 | 12/1989 | Japan . |
| 2-60185 | 2/1990 | Japan . |
| 2143583 | 6/1990 | Japan . |
| 4188886 | 7/1992 | Japan . |
| 6244351 | 9/1994 | Japan . |
| 7077697 | 3/1995 | Japan . |

*Primary Examiner*—Steven J. Saras
*Assistant Examiner*—David L Lewis
*Attorney, Agent, or Firm*—Fitzpatrick, Cella, Harper & Scinto

[57] ABSTRACT

A printed circuit board comprises a plurality of board layers and a plurality of wiring layers both of which are laminated. When a wiring pattern is disposed at one side against the center line, a dummy wiring pattern is formed at the place substantially symmetrical to the position where the wiring pattern is disposed to suppress a warp of the printed circuit board caused by temperature changes and to ease connection work between the printed circuit board and units, such as TABs for driving liquid crystal.

8 Claims, 3 Drawing Sheets

FIG. 2
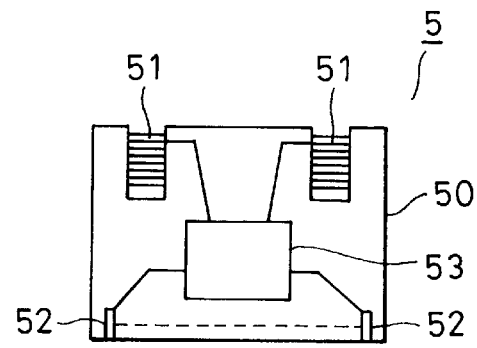
FIG. 3
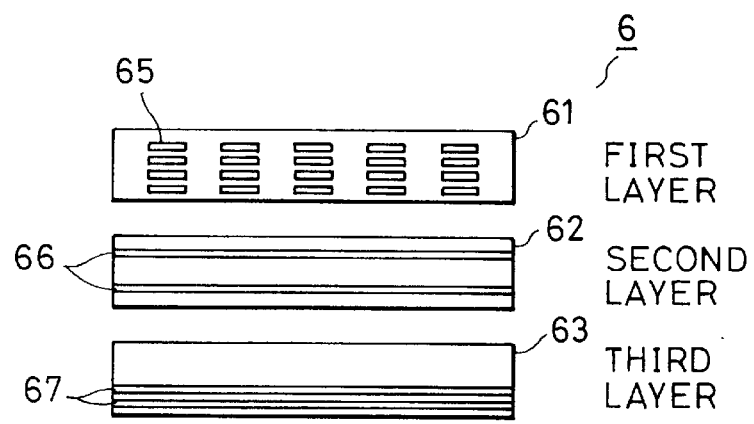
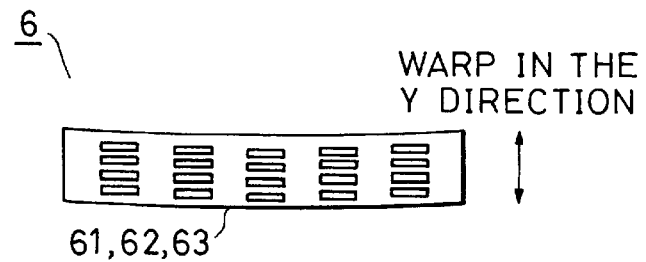
FIG. 4(a)
FIG. 4(b)

ELECTRIC-CIRCUIT BOARD FOR A DISPLAY APPARATUS

BACKGROUND OF THE INVENTION

1. Field of the Invention

The present invention relates to an electric-circuit board and a display apparatus having the board.

2. Description of the Related Art

An electric-circuit board in which wiring-pattern paths can be selected as desired has been used in various fields. It is also used in a liquid-crystal display apparatus for sending various types of signals.

A liquid-crystal display apparatus 1 which is configured as shown in FIG. 1 has a liquid-crystal display device (liquid-crystal panel) P. The liquid-crystal display device P includes a pair of glass substrates 2 and 3 disposed oppositely to each other and clamping liquid crystal. On each of these glass substrates 2 and 3, transparent electrodes are disposed in a matrix. The glass substrates 2 and 3 are configured in different shapes such that the glass substrate 2 is wider than the glass substrate 3 at the upper and lower edges in FIG. 1 and the glass substrate 3 is longer than the glass substrate 2 at the left edge. At the glass-substrate edges where only one glass substrate appears, transparent electrodes formed on the corresponding glass-substrate surfaces are exposed.

Tape automated bonding films (hereinafter called TABs) 5, each of which supports IC 53 for driving liquid crystal serving as driving means, are connected to the exposed portions of the transparent electrodes. As a result, IC53s and TABs 5 for driving the liquid crystal enclose the liquid-crystal display device P at three sides. As shown in detail in FIG. 2, a TAB 5 for driving the liquid crystal has a flexible base-film section (film carrier) 50 made from polyimide resin or the like, and input terminal sections 51 and output terminal sections 52 are formed by wiring patterns made by copper foil or the like on the base-film section 50. Between these terminal sections 51 and 52, IC53 for driving the liquid crystal is tape-automated-bonded. IC53 converts a signal from the input terminal sections 51 to the signal having the specified waveform and outputs the signal to the liquid-crystal display device P through the output terminal sections 52. The output terminal sections 52 on a TAB 5 are electrically connected to the liquid-crystal display device P with, for example, anisotropic electrically-conductive film. With the anisotropic electrically-conductive film being clamped by the exposed electrodes of the liquid-crystal display device P and the output terminal sections 52, thermal crimping is performed to assure electrical conduct.

The input terminal sections 51 of TABs 5 for driving the liquid crystal are connected to a printed circuit board (PCB) 6 by soldering. A control unit not shown sends a power signal and control signals through the PCB 6 to the TABs 5 for driving the liquid crystal and the TABs 5 for driving the liquid crystal applies the signal having the specified waveform to the liquid-crystal display device P to display various types of information.

The configuration of the PCB 6 will be described next by referring to FIG. 3.

The PCB 6 is configured by three laminated base members 61, 62, and 63 made from insulating materials such as glass epoxy. On the surfaces of the base members 61, 62, and 63, wiring patterns 65, 66, and 67 are formed by copper foil having a width of 5 to 20 µm on the first to third layers. The first-layer wiring pattern 65 is used as a land pattern to mount the PCB to the TABs 5. The second-layer wiring pattern 66 is used for applying a power signal to the TABs 5. The third-layer wiring pattern 67 is used for applying control signals to the TABs 5. These wiring patterns 65, 66, and 67 are formed such that they are short to reduce the wiring-pattern resistance. Each wiring pattern is connected to each other by through holes (not shown) made on the base members.

The PCB 6 is deformed due to thermal expansion of the wiring pattern 67 as the ambient temperature rises because the thermal expansion rate of the wiring pattern 67 made of copper foil or the like is larger than that of the base member 61, made from glass epoxy. The inventors found that this deformation was caused by wiring patterns.

As shown in FIG. 3, the first-layer wiring pattern 65 and the second-layer wiring pattern 66 are formed symmetrically against the center lines vertically according to the circuit configuration, and the third-layer wiring pattern 67 is not formed symmetrically against the center line vertically. The PCB 6 used for this liquid-crystal display apparatus has a longitudinal shape.

As the ambient temperature rises the lower half of the base member 63 expands where the wiring pattern 67 is disposed and the upper half of the base member 63 expands little where the wiring pattern 67 is not disposed, resulting in a warp in the Y direction in the PCB 6 as shown in FIG. 4A. In some cases, a warp occurs in the thickness direction (Z direction) as shown in FIG. 4B. This warp is a problem especially for a display panel having a 15-inch or larger display screen, since the PCB 6 is required to be long.

Such a warp makes soldering between the PCB 6 and the TABs 5 in the manufacturing process of the liquid-crystal display apparatus complicated. It becomes difficult to align the input terminal sections 51 of the TABs 5 to the wiring pattern 65 (land pattern for mounting the TABs 5) of the PCB 6, resulting in long positioning work or disabling the soldering itself.

SUMMARY OF THE INVENTION

Accordingly, it is an object of the present invention to provide an electric-circuit board which can solve the foregoing problems, that is, can suppress a warp due to temperature changes by forming wiring patterns at appropriate positions.

The foregoing object is achieved according to the present invention through the provision of an electric-circuit board having a base member made from an insulating material and a wiring pattern formed on the base member, wherein the wiring pattern is disposed to suppress a warp of the electric-circuit board. It is preferred that the wiring pattern includes a first wiring pattern for sending control signals and power signals and a second wiring pattern which is not used for sending those signals and the first wiring pattern and the second wiring pattern are disposed to suppress a warp of the electric-circuit board. It may be configured that the first wiring pattern and the second wiring pattern have substantially the same shapes and the first wiring pattern and the second wiring pattern are disposed at positions substantially symmetrically on the electric-circuit board to suppress a warp of the electric-circuit board caused by temperature changes. It may also be configured that the second wiring pattern holds a reference voltage. Further, it is also preferred that the electric-circuit board comprises a plurality of board layers and a plurality of wiring-pattern layers both of which are laminated.

The foregoing object is also achieved according to the present invention through the provision of a display apparatus comprising: an electric-circuit board according to one of the above-described boards; driving means connected to the electric-circuit board for converting a signal from the electric-circuit board to the signal having the specified waveform; and a liquid-crystal display device in which liquid crystal is clamped between a pair of substrates, wherein the driving means is connected to the liquid-crystal display device and applies the signal having the specified waveform to the liquid-crystal display device to display various types of information.

As the ambient temperature rises, a wiring pattern made of a material having a high thermal expansion rate expands on a board, resulting in a little deformation of the board. Since the wiring pattern is appropriately disposed in the present invention, the board is deformed uniformly, suppressing a warp.

According to the present invention, in addition to a first wiring pattern for sending control signals and the power signal, a second wiring pattern which does not send such signals is formed, suppressing a warp due to temperature changes. The foregoing problems can be solved.

Also according to the present invention, when the first wiring pattern and the second wiring pattern have substantially the same shapes and they are disposed symmetrically to each other, a warp due to temperature changes are suppressed, solving the foregoing problems.

Still also according to the present invention, when the second wiring pattern holds a reference voltage, noise occurrence can be suppressed as well as the foregoing problems are solved.

BRIEF DESCRIPTION OF THE DRAWINGS

FIG. 2 is a plan showing a detailed configuration of a TAB for driving liquid crystal.

FIG. 3 is a view showing a detailed configuration of a conventional PCB.

FIGS. 4(a) and 4(b) are views illustrating problems of the conventional PCB.

DETAILED DESCRIPTION OF THE PREFERRED EMBODIMENTS

Figure 1:
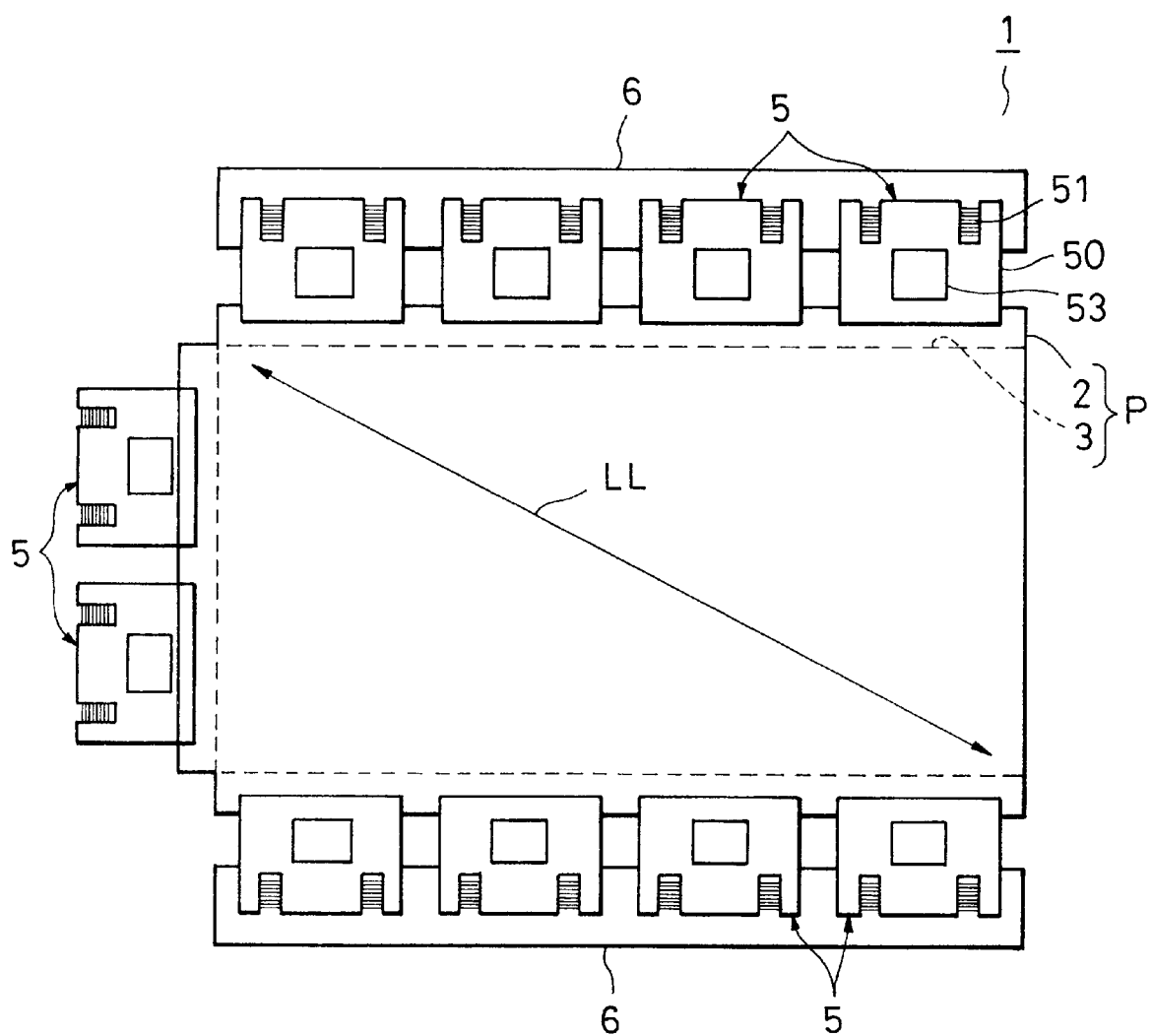
FIG. 1 is a plan illustrating a configuration of a liquid-crystal display apparatus having a printed circuit board (PCB).

Embodiments of the present invention will be described below by referring to the drawings. The same portions as those shown in FIGS. 1 and 2 are assigned the same symbols and the descriptions thereof are omitted.

Figure 5:
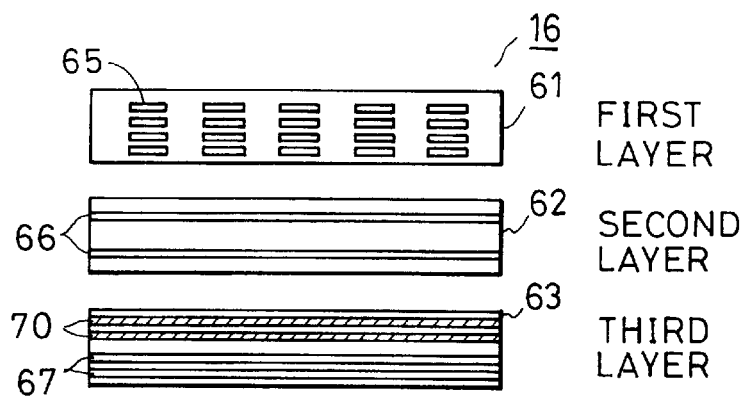
FIG. 5 is a view showing the configuration of a PCB according to the present invention.

FIG. 5 is a plan of three base members of an electric-circuit board for a display apparatus having a diagonal length of 15 inches according to an embodiment of the present invention.

In the embodiment, wiring patterns in the third layer of a three-layer printed circuit board 16 includes a wiring pattern 67 (a first wiring pattern) for sending control signals and a dummy wiring pattern 70 (a second wiring pattern) which is not used for sending the control signals. The dummy wiring pattern 70 and the wiring pattern 67 are made such that they have the same width (shape) and the same number of pattern blocks, and they are disposed vertical-symmetrically against the center lines. The PCB 16 is used for the liquid-crystal display apparatus 1 (shown in FIG. 1). The dummy wiring pattern 70 is connected to the ground line (not shown) of the liquid-crystal display apparatus 1 and maintained to be the reference voltage. Each of a wiring pattern 65 on the first layer and a wiring pattern 66 on the second layer are disposed vertical-symmetrically.

Operations and advantages of the embodiment will be described next.

According to the embodiment, since the wiring patterns 67 and 70 in the third layer as well as the wiring pattern 65 in the first layer and the wiring pattern 66 in the second layer are formed vertical-symmetrically in the figure, if the ambient temperature changes, a warp of the PCB 16 in a plane is suppressed. Therefore, soldering between the PCB 16 and the TABs 5 is easy in the manufacturing process for the liquid-crystal display apparatus, reducing the manufacturing cost.

In addition, maintaining the dummy wiring pattern 70 at the reference voltage suppresses influences by noise or the like.

In the above embodiment, the dummy wiring pattern 70 has the same shape as the wiring pattern 67. The dummy wiring pattern 70 may have a different shape from that of the wiring pattern 67.

Other embodiments will be described next by referring to FIGS. 6 and 7.

Figure 6:
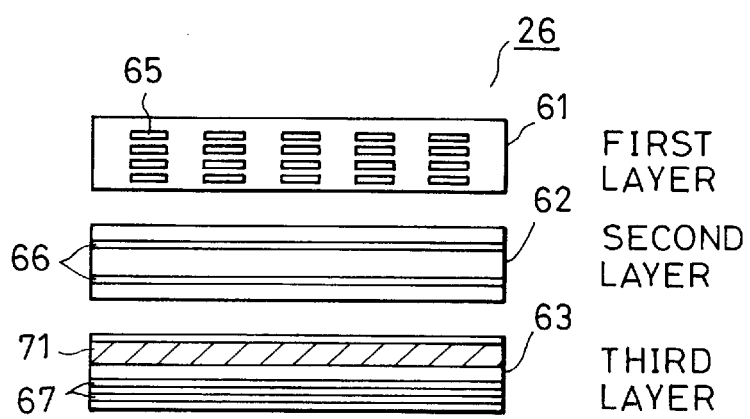
FIG. 6 is a view showing the configuration of another PCB according to the present invention.

In a PCB 26 shown in FIG. 6, a dummy wiring pattern (a second wiring pattern) 71 wider than a wiring pattern 67 (a first wiring pattern) is formed. This dummy wiring pattern 71 is formed at an appropriate position so that a warp does not occur in a base member 63.

Figure 7:
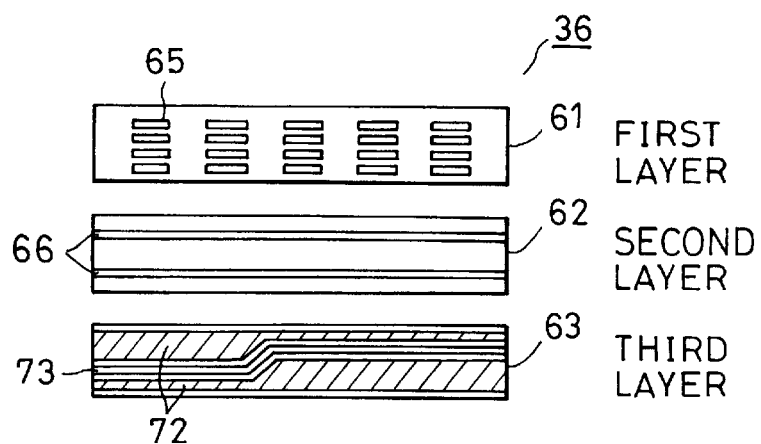
FIG. 7 is a view illustrating the configuration of still another PCB according to the present invention.

In a PCB 36 shown in FIG. 7, a wiring pattern (a first wiring pattern) 72 having wide portions and narrow portions is formed along the upper and lower edges of a base member 63. Between the wide and narrow portions of the different pattern blocks in the wiring pattern 72, a dummy wiring pattern 73 having the specified shape is disposed. The shape and the position of the dummy wiring pattern can be any shape and any position unless a warp occurs. These PCBs 26 and 36 have the same advantages as the PCB 16.

In the above embodiments, warp suppression is described in a case when the wiring pattern 67 in the third layer is not disposed vertical-symmetrically. The present invention can also be applied to other cases when, for example, the wiring pattern 65 in the first layer or the wiring pattern 66 in the second layer is not disposed vertical-symmetrically.

As described above, the present invention suppresses a warp of a PCB caused by temperature changes.

According to the present invention, the second wiring pattern holding the reference voltage is provided as well as the first wiring pattern for sending control and other signals, suppressing a warp of the PCB caused by temperature changes and also suppressing influences of noise.

When an electric-circuit board according to the present invention is used for a liquid-crystal display apparatus, a warp of the electric-circuit board is suppressed even if the ambient temperature is inappropriate in the manufacturing process of the liquid-crystal display apparatus. This simplifies connection to the driving means and also reduces the manufacturing cost.

What is claimed is:

1. An electric-circuit board for a display apparatus, comprising:

a base member made from an insulating material;

a wiring pattern formed on said base member, said wiring pattern including a first wiring pattern for sending control signals and/or power signals and a second wiring pattern which is not used for sending said signals, wherein both said first wiring pattern and said second wiring pattern are disposed on at least one and the same side of said base member, said second wiring pattern is disposed to suppress warping of said electric-circuit board caused by said first wiring pattern formed on the same side of said base member as said second wiring pattern, said second wiring pattern suppresses warping of said electric-circuit board due to the positional relationship between said first and second wiring patterns formed on the same side of said base member, and said first wiring pattern and said second wiring pattern have substantially the same shapes and said first wiring pattern and said second wiring pattern are disposed at Positions substantially symmetrically on said electric-circuit board to suppress a warp of said electric-circuit board caused by temperature changes.

2. An electric-circuit board for a display apparatus according to claim 1, wherein said second wiring pattern holds a reference voltage.

3. An electric-circuit board for a display apparatus according to claim 1, wherein said electric-circuit board comprises a plurality of board layers and a wiring-pattern layer laminated on each said board layer.

4. An electric-circuit board for a display apparatus according to claim 1, wherein said second wiring-pattern holds a reference voltage.

5. A display apparatus comprising:

an electric-circuit board having a base member made from an insulating material and a wiring pattern formed on said base member, said wiring pattern including a first wiring pattern for sending control signals and/or power signals and a second wiring pattern which is not used for sending said signals, wherein both said first wiring pattern and said second wiring pattern are disposed on at least one and the same side of said base member, said second wiring pattern is disposed to suppress warping of said electric-circuit board caused by said first wiring pattern formed on the same side as said second wiring pattern of said base member, said second wiring pattern suppresses warping of said electric-circuit board due to the positional relationship between said first and second wiring patterns formed on the same side of said base member, and said first wiring pattern and said second wiring pattern have substantially the same shapes and said first wiring pattern and said second wiring pattern are disposed at positions substantially symmetrically on said electric-circuit board to suppress a warp of said electric-circuit board caused by temperature changes;

driving means connected to said electric-circuit board for converting a signal from said electric-circuit board to a signal having a specified waveform; and a liquid-crystal display device in which liquid crystal is clamped between a pair of substrates, wherein said driving means is connected to said liquid-crystal display device and applies the specified waveform signal to said liquid-crystal display device to display various types of information.

6. A display apparatus according to claim 5, wherein said electric-circuit board is disposed along at least one side of a display panel including a screen having a diagonal length of 15 inches.

7. An electric-circuit board for a display apparatus according to claim 5, wherein said second wiring pattern holds a reference voltage.

8. An electric-circuit board for a display apparatus according to claim 5, wherein said electric-circuit board comprises a plurality of board layers and a wiring-pattern layer laminated on each said board layer.

* * * * *

UNITED STATES PATENT AND TRADEMARK OFFICE
CERTIFICATE OF CORRECTION

Page 1 of 2

PATENT NO. : 5,912,654

DATED : June 15, 1999

INVENTOR(S) : Ouichi et al.

It is certified that error appears in the above-identified patent and that said Letters Patent is hereby corrected as shown below: On the title page, item:

[56] REFERENCES CITED:

FOREIGN PATENT DOCUMENTS, "1300590          --1-300590
                         2143583  should   2-143583
                         4188886  read     4-188886
                         7077697           7-077697
                         6244351"          6-244351--.

COLUMN 1:

Line 31, "IC53s" should read --IC's 53--.

UNITED STATES PATENT AND TRADEMARK OFFICE
CERTIFICATE OF CORRECTION

PATENT NO. : 5,912,654
DATED : June 15, 1999
INVENTOR(S) : Ouichi et al.

It is certified that error appears in the above-identified patent and that said Letters Patent is hereby corrected as shown below:

COLUMN 5:

Line 24, "Positions" should read --positions--.

Signed and Sealed this

Eighteenth Day of April, 2000

Attest:

Q. TODD DICKINSON

Attesting Officer    Director of Patents and Trademarks